United States Patent [19]

Riley et al.

[11] Patent Number: 4,803,531
[45] Date of Patent: Feb. 7, 1989

[54] IMAGING CHARGE-COUPLED DEVICE HAVING AN ALL PARALLEL OUTPUT

[75] Inventors: Larry D. Riley, Beaverton; Denis L. Heidtmann, Portland, both of Oreg.

[73] Assignee: Tektronix, Inc., Beaverton, Oreg.

[21] Appl. No.: 98,574

[22] Filed: Sep. 18, 1987

[51] Int. Cl.[4] .................... H01L 29/78; G11C 19/28
[52] U.S. Cl. ......................... 357/24; 377/60
[58] Field of Search ....................... 357/24; 377/57-63

[56] References Cited

U.S. PATENT DOCUMENTS

| | | | |
|---|---|---|---|
| 3,971,003 | 7/1976 | Kosonocky | 357/24 LR |
| 4,321,584 | 3/1982 | McNutt | 357/24 M |
| 4,612,580 | 9/1986 | Weimer | 357/24 LR |
| 4,649,554 | 3/1987 | Boudewijns et al. | 377/60 |
| 4,660,064 | 4/1987 | Hamasaki | 357/24 M |

OTHER PUBLICATIONS

Schlig "CCD Floating Diffusion Output Tap" IBM Technical Disclosure Bulletin vol. 25 (4/83) pp. 5936-5937.

Primary Examiner—Gene M. Munson
Attorney, Agent, or Firm—William S. Lovell; John Smith-Hill

[57] ABSTRACT

A charge-coupled device comprises a substrate of semiconductor material having at least two buried channels formed therein. At least two sets of clock electrodes overlie the buried channels. By application of appropriate potentials to the clock electrodes, an electrical charge may be propagated in controlled fashion along each buried channel towards its output end. A floating diffusion is formed at the output end of each buried channel for receiving charge propagated along the channel. Output transistors are assoicated with the buried channels respectively and each has a control electrode connected to the floating diffusion of the associated channel. An output diffusion is located between the floating diffusions and the control electrodes of the transistors and extends perpendicular to the channels. A reset gate is associated with each channel and lies over the substrate between the floating diffusion of the associated channel and the output diffusion, so that by application of a predetermined potential to the reset gate a conductive channel is formed in the substrate between the floating diffusion of the associated channel and the output diffusion. A reset bus extends over the substrate on the opposite side of the floating diffusions from the reset gate and has a bus extension which extends over the substrate between the floating diffusions and is connected to the reset gates.

4 Claims, 2 Drawing Sheets

IMAGING CHARGE-COUPLED DEVICE HAVING AN ALL PARALLEL OUTPUT

BACKGROUND OF THE INVENTION

This invention relates to an imaging chargecoupled device (CCD) having an all parallel output.

One form of imaging CCD comprises a silicon die which has been processed using conventional MOS technology to form a plurality of buried channels beneath its front surface (the surface through which the die is processed). Each channel is made up of a linear array of like elementary regions. A clocking electrode structure overlies the front surface of the die, and by application of selected potentials to the clocking electrode structure, charge present in a given elementary region of a channel may be advanced through the linear array of elementary regions, in the manner of a shift register, and extracted from the channel. In an imaging CCD, charges are generated in the channels photoelectrically. Thus, if electromagnetic radiation is incident on the substrate beneath the channel layer it may cause generation of conduction electrons and these conduction electrons may enter the channel layer and become confined in one of the elementary channel regions. The diffusion length of the conduction electrons is sufficiently short that a conduction electron generated in the substrate will not pass by diffusion farther than the elementary channel region that immediately overlies the substrate region in which the conduction electron was generated.

The imaging CCD is placed with the back surface of the die at the focal plane of a camera so that the camera lens forms an image of a scene on the back surface of the die. The CCD may comprise, e.g., 64 parallel channels each having 64 elementary regions and the resulting 64×64 array of elementary regions resolves the back, or image receiving, surface of the die into 64×64 picture elements or pixels. The camera has a shutter which is opened for a predetermined exposure interval, during which all electrodes of the clocking electrode structure remain at constant potentials. The shutter is then closed, and the charge accumulated in the elementary channel regions is clocked out of the CCD. The intensity of the optical energy incident on a given pixel during the exposure interval can influence the electron population of the associated elementary region of the channel layer, and so the number of electrons that are transferred out of an elementary region, and ultimately extracted from the CCD, is representative of the intensity of the light incident on the pixel. In this manner, the CCD can be used to generate a two-dimensionally sampled electrical signal representative of the distribution of light intensity over the image receiving surface of the CCD, i.e. of the image formed by the camera lens.

In a known imaging CCD having 64 parallel channels, the pixel charge samples are clocked out of the channels into a parallel in, serial out shift register and are shifted through the shift register to a floating diffusion, which is electrically coupled to the gate electrode of an output field-effect transistor. The voltage at the source electrode of the output FET depends on the voltage at the gate electrode. In order to prevent the voltage at the gate electrode of the output FET from being influenced by pixel charge samples that have previously been applied to the floating diffusion, a reset gate is used to reset the floating diffusion to a reference potential at a predetermined time after each pixel sample charge has been deposited in the floating diffusion. Thus, the floating diffusion is spaced from an output diffusion, and a reset gate lies over a channel region defined between the floating diffusion and the output diffusion. When an appropriate potential is applied to the reset gate, charge is able to flow through the channel region between the output diffusion and the floating diffusion and the floating diffusion is brought to the same potential as the output diffusion.

If the pixel charge samples are shifted through the columns of the CCD at a frequency $f_c$ and the CCD has 64 columns, the rate at which pixel charge samples are shifted out of the shift register is 64 $f_c$. Therefore, the rate at which pixel charge samples can be shifted out of the shift register imposes a limit on $f_c$.

In order to maximize $f_c$, it has been proposed that each channel of the imaging CCD should have its own floating diffusion, connected by a floating diffusion bus to the gate electrode of its own output FET, so that the CCD provides an all parallel output. The source electrodes of the output FETs may then be applied through suitable amplification and other circuits to a parallel processing computer. In this fashion, the rate at which pixel charge samples are shifted through the channels of the CCD is made independent of the number of columns.

A difficulty that has been encountered with such an all parallel output imaging CCD is that it is necessary to provide a reset bus which is connected to the reset gates. If the reset bus passes over the surface of the CCD at a location between the floating diffusions and the gate electrodes of the output FETs, the reset bus is strongly coupled to the floating diffusion buses. When a reset pulse is applied to the reset bus, noise is introduced on the floating diffusion buses and influences the voltage detected at the source electrodes of the output FETs.

SUMMARY OF THE INVENTION

A preferred embodiment of the present invention is a charge-coupled device which comprises a substrate of semiconductor material having at least two buried channels formed therein. At least two sets of clock electrodes overlie the buried channels. By application of appropriate potentials to the clock electrodes, an electrical charge may be propagated in controlled fashion along each channel towards an output end thereof. A floating diffusion is formed at the output end of each buried channel for receiving charge propagated along the channel. Output transistors are associated with the buried channels respectively and each has a control electrode connected to the floating diffusion of the associated channel. An output diffusion is located between the floating diffusions and the control electrodes of the transistors and extends transversely of the channels. A reset gate is associated with each channel and lies over the substrate between the floating diffusion of the associated channel and the output diffusion, so that by application of a predetermined potential to the reset gate a conductive channel is formed in the substrate between the floating diffusion of the associated channel and the output diffusion. A reset bus extends over the substrate on the opposite side of the floating diffusions from the reset gate and has a bus extension which extends over the substrate between the floating diffusions and is connected to the reset gates.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
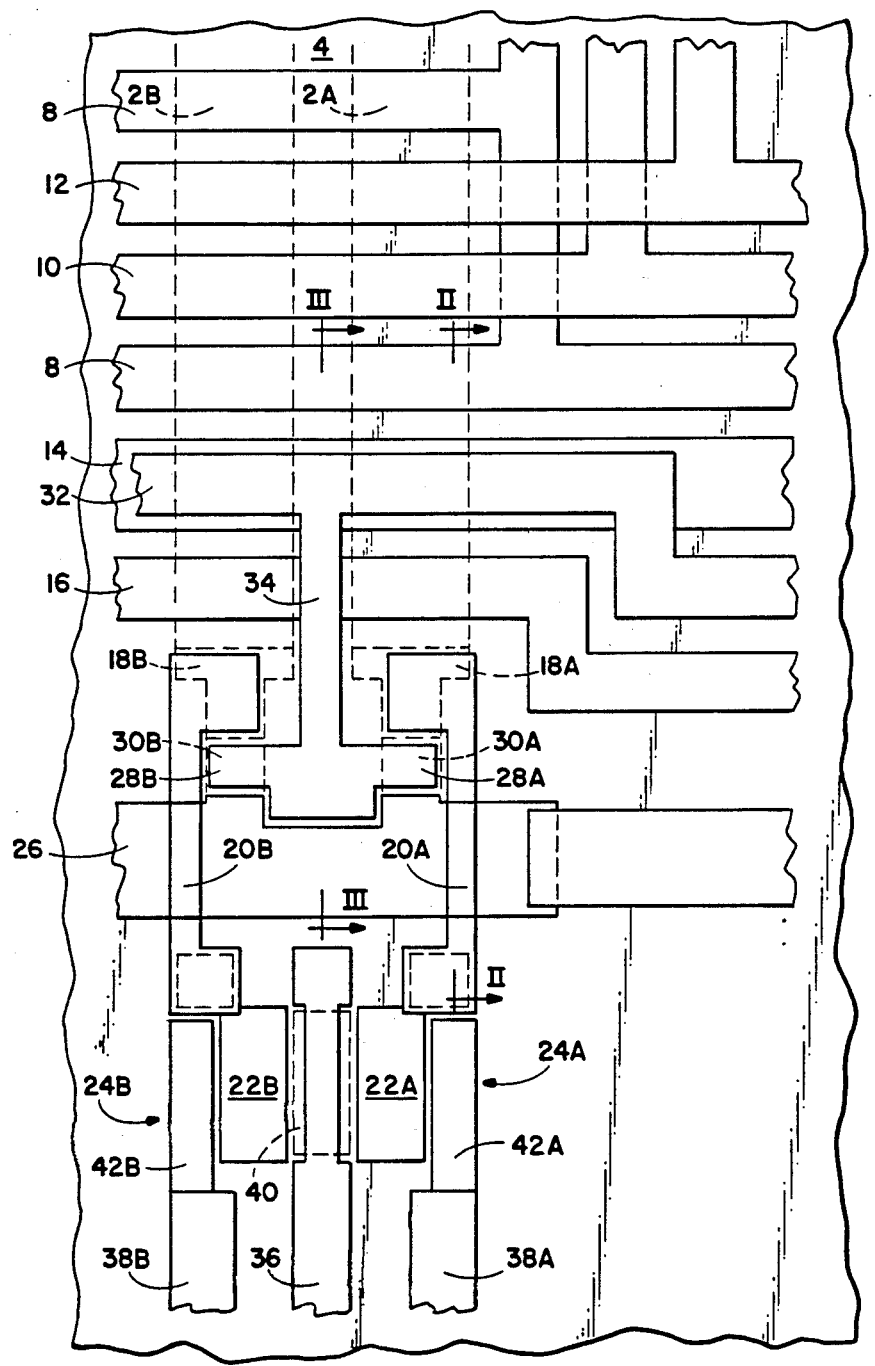
FIG. 1 is a partial plan view in simplified form of an imaging CCD embodying the present invention.

The illustrated CCD is fabricated using a substrate of p type silicon. Sixty four buried channels 2 of n conductivity are formed in the substrate. The output ends of two of the channels 2A and 2B are shown in FIG. 1. In this specification and in the drawings, the suffixes A and B are used to denote features which relate to the channels 2A and 2B respectively. Aligned with each of the channels 2 at its output end is a floating diffusion 18 of n+ conductivity and a reset channel region 30 of n conductivity. The floating diffusions 18 and the reset channels 30 lie between the channel 2 and an output diffusion 26 of n+ conductivity, which extends perpendicular to the channels 2 and is connected to a D.C. potential of +20 volts with respect to the substrate. Channel stop regions 4 of p+ conductivity extend between the channels 2, between the floating diffusions 18 and between the reset channels 30, terminating at the output diffusion 26.

Figure 2:
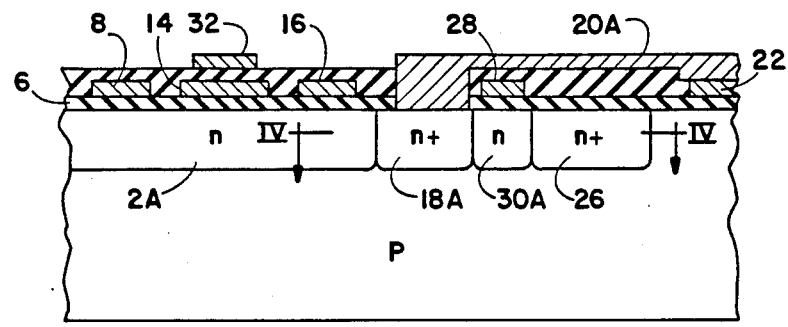
FIG. 2 is an enlarged sectional view taken on the line II—II of FIG. 1.
Figure 3:
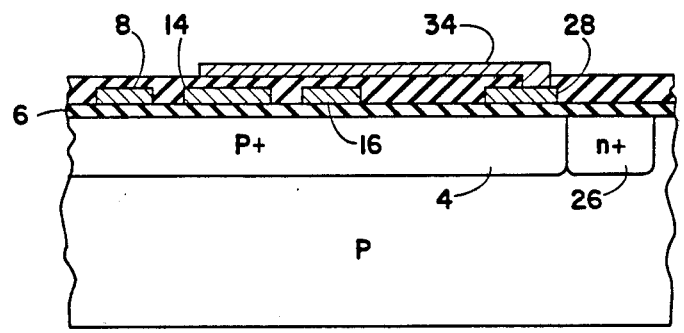
FIG. 3 is an enlarged sectional view taken on the line III—III of FIG. 1.
Figure 4:
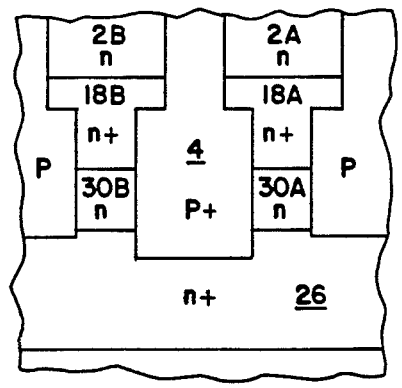
FIG. 4 is a sectional view taken on the line IV—IV of FIG. 2.

As shown in FIG. 2, a layer 6 of silicon dioxide extends over the substrate, and as shown in FIG. 1, three arrays of polysilicon clock electrodes 8, 10 and 12 are formed on top of the layer 6. The three arrays form a repeating pattern over the length of each channel. As shown in FIGS. 2 and 3, a polysilicon sum well gate 14 and a polysilicon last gate 16 extend over the layer 6 parallel to the clock electrodes. By application of suitable potentials to the electrodes of the three arrays 8, 10 and 12, charge that is generated in the substrate and diffuses into one of the channels 2 is shifted down the channel in orderly fashion. The sum well gate 14 and the last gate 16 may be clocked at the same frequency as the clock electrodes 8, 10 and 12, in which case the successive pixel charge samples are deposited sequentially in the floating diffusion 18. Alternatively, the sum well gate and the last gate may be clocked at a reduced frequency, in which case a controlled number of pixel charge samples are accumulated in a sum well formed in each channel and the accumulated charge is deposited in the floating diffusion. This alternative clocking arrangement provides an improved signal-to-noise ratio, but at the expense of reduced resolution. The last gate 16 is not always clocked, but may be held at a D.C. potential that is less positive than that of the output diffusion 26, in order to decouple the changing potentials of the clock electrodes 8, 10 and 12 and the sum well gate 14 from the floating diffusions 18.

Each floating diffusion 18 is connected to a floating diffusion bus 20 which is made of metal and extends over the output diffusion 26. Each floating diffusion bus 20 is connected to the polysilicon gate electrode 22 of an output field effect transistor 24. The FETs 24A and 24B, for example, associated with two adjacent channels have a common n+ drain diffusion 40 which is connected to a metal drain electrode 36. Each FET also has an n+ source diffusion 42 which is connected to a metal source electrode 38.

A polysilicon reset gate 28 lies over the reset channel region 30 and is connected to a metal reset bus 32 which is on the opposite side of the floating diffusions 18 from the reset gates 28 by a metal bus extension 34 which passes over the channel stop region 4 and between the two floating diffusions 18A and 18B of the channels 2A and 2B respectively.

When charge is deposited in the floating diffusion 18A, for example, a voltage is applied through the floating diffusion bus 20A to the gate electrode 22A of the output FET 24A. The voltage at the source electrode 38A of the output FET 24A assumes a value that depends on the voltage applied to the gate electrode 22A. This voltage may be applied to an analog-to-digital converter (not shown) to generate a digital signal for application to a parallel processing computer. After the voltages at the source electrodes 38 have settled and been read, a higher voltage reset pulse, e.g. about +15 volts, is applied to the reset bus 32, and conductive channels are established through the regions 30 between the floating diffusions 18 and the output diffusion. Each floating diffusion is thereby brought to the potential of the output diffusion and thereby conditioned to receive a new deposit of charge.

It will be seen that the floating diffusion buses are not crossed by the reset bus or the bus extensions and therefore the capacitive coupling between the reset bus and the floating diffusion buses is very weak. Accordingly, the relatively high voltage pulses applied to the reset bus do not introduce significant noise on the floating diffusions.

It will be appreciated that the present invention is not restricted to the particular embodiment that has been described and illustrated, and that variations may be made therein without departing from the scope of the invention as defined in the appended claims and equivalents thereof.

We claim:

1. A charge-coupled device comprising:
   a substrate of semiconductor material having at least first and second buried channels formed therein,
   at least two sets of clock electrodes overlying both the first and second buried channels, so that by application of predetermined potential levels to the clock electrodes, electrical charge may be propagated in controlled fashion along each of the buried channels towards an output end thereof,
   a floating diffusion at the output end of each buried channel for receiving charge propagated along the channel,
   output transistors associated with the buried channels respectively and each having a control electrode connected to the floating diffusion of the associated buried channel,
   an output diffusion formed in the substrate at a location between the floating diffusions of the channels and the control electrodes of the transistors and extending transversely of the channels,
   a reset gate associated with each channel and lying over the substrate between the floating diffusion of the associated channel and the output diffusion, so that by application of a predetermined potential to the reset gate a conductive channel is formed in the substrate between the floating diffusion and the output diffusion, and a reset bus extending over the substrate on the opposite side of the floating diffusions from the reset gate, the reset bus having a bus extension which extends over the substrate between the floating diffusions and is connected to the reset gates.

2. A charge-coupled device according to claim 1, further comprising a sum well gate which extends over the substrate between the floating diffusions and the clock electrodes, and wherein the reset bus extends over the sum well gate.

3. A charge-coupled device according to claim 1, comprising a channel stop region which is located between the first and second channels, and wherein the bus extension extends over the channel stop region.

4. A charge-coupled device according to claim 1, comprising a floating diffusion bus associated with each buried channel and connecting the floating diffusion associated with the buried channel to the control electrode of the output transistor associated with the buried channel, the floating diffusion buses extending substantially parallel to and in spaced relationship with the bus extensions.

* * * * *

UNITED STATES PATENT AND TRADEMARK OFFICE
CERTIFICATE OF CORRECTION

PATENT NO. : 4,803,531

DATED : February 7, 1989

INVENTOR(S) : Larry D. Riley & Denis L. Heidtmann

It is certified that error appears in the above-identified patent and that said Letters Patent is hereby corrected as shown below:

Col. 1, line 4, insert the following notice:

--The U.S. Government has a paid-up license in this invention and the right in limited circumstances to require the patent owner to license others on reasonable terms as provided for by the terms of contract No. N00014-85-C-0627 awarded by the Department of the Navy.--

Signed and Sealed this

Fifth Day of October, 1993

*Attest:*

BRUCE LEHMAN

*Attesting Officer*    *Commissioner of Patents and Trademarks*